United States Patent
Behringer et al.

(10) Patent No.: US 6,186,631 B1
(45) Date of Patent: Feb. 13, 2001

(54) TWO-SECTION SEMICONDUCTOR OPTICAL AMPLIFIER

(75) Inventors: Robert E. Behringer, Monmouth Beach; Kevin F. Dreyer, Cliffwood, both of NJ (US); Chih-Hsiao Chen, Hsin-Cho (JP); Mingdeh Chien, Allentown, PA (US); Uziel Koren, Fair Haven; Barry I. Miller, Middletown, both of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/241,969

(22) Filed: Feb. 2, 1999

Related U.S. Application Data

(60) Provisional application No. 60/074,648, filed on Feb. 13, 1998.

(51) Int. Cl.[7] ....................................................... H01S 3/00
(52) U.S. Cl. ............................................................ 357/344
(58) Field of Search .................................. 359/344; 372/6

(56) References Cited

U.S. PATENT DOCUMENTS

| | | | |
|---|---|---|---|
| 5,175,643 | * 12/1992 | Andrews | 359/339 |
| 5,457,569 | * 10/1995 | Liou et al. | 359/344 |
| 5,930,031 | * 7/1999 | Zhou et al. | 359/344 |
| 6,040,938 | * 3/2000 | Ducellier | 359/394 |

OTHER PUBLICATIONS

Marcenac, D.D. et al., *Bandwidth enhancement of wavelength conversion via cross–gain modulation by semiconductor optical amplifier cascade*, Electronics Letters, Aug. 17th, 1995, vol. 31, No. 17, pp. 1442–1443.

Castro, J.C.S. et al., *Improved Signal to Noise Ratio in Gain–Levered Laser*, Electronics Letters, Jul. 1995, vol. 31, pp. 1156–1157.

* cited by examiner

*Primary Examiner*—Mark Hellner
(74) *Attorney, Agent, or Firm*—Darby & Darby

(57) ABSTRACT

A unitary two-section semiconductor optical amplifier including a first active region, a second active region, and a passive region integrally connected between the first and second active regions to minimize optical loss therebetween. The arrangement of the two-section semiconductor optical amplifier is advantageous in that the gain in the first active region may be increased in order to maintain a substantially constant input power level to the second active region over a relatively wide dynamic range of input power levels to the first active region.

23 Claims, 4 Drawing Sheets

TWO-SECTION SEMICONDUCTOR OPTICAL AMPLIFIER

CROSS-REFERENCES TO RELATED APPLICATIONS

This application claims the benefit of U.S. Provisional Application No. 60/074,648, filed Feb. 13, 1998, which is incorporated herein by reference.

FIELD OF THE INVENTION

The present invention relates to optical amplifiers, and in particular, to a two-section semiconductor optical amplifier with increased output power and a relatively wide dynamic range, and a process for manufacturing the same.

DESCRIPTION OF RELATED ART

The increasing complexity of high density wave division multiplex (WDM) and time division multiplex (TDM) networks, requires a significant number of optical amplifiers to compensate for losses in multiplexing, splitting, switching, or wavelength converting. Optical amplifiers in conjunction with integrated or hybrid power monitors may be used as optical power equalizers for receiving a relatively wide range of input power and delivering substantially constant power for devices with a relatively narrow dynamic range, such as an optical N×N switch or an all-optical wavelength converter.

Conventional single section semiconductor optical amplifiers (SOAs) have been widely used to meet these needs. The use of SOAs is advantageous in that they are less expensive and smaller in overall size than fiber amplifiers. Undesirably, however, the gain saturation of SOAs limit both the output power level and dynamic range of the input signal. Furthermore, as shown in the waveform in FIG. 1, for a conventional single section SOA having an output power of 1.5 dBm, an input power of 6.2 dBm, and an injection current of 106 mA, the signal pulses are distorted by gain saturation. Specifically, the beginning photons of the pulses experience a higher (unsaturated) gain than later photons.

It is therefore desirable to develop a semiconductor optical amplifier that has an increased saturation output power, while reducing the effects of gain saturation over a relatively wide input dynamic range.

SUMMARY OF THE INVENTION

The present invention is directed to a unitary two-section semiconductor optical amplifier including a first active region, a second active region, and a passive region integrally connected between the first and second active regions to minimize optical loss therebetween. The gain in the first active region may be increased so that an input power level to the second active region remains substantially constant over a predetermined range of first input power levels.

In addition, the invention is directed to a method of fabricating the unitary two-section semiconductor optical amplifier described above by epitaxial growth deposition of the semiconductor and later removal of a portion of the semiconductor to define a passive region. Initially, at least one passive waveguide layer is grown to form a wafer. An etch stop layer, at least one quantum well layer, and a cladding layer are then grown on top of the at least one passive waveguide layer, in that order. Then, a photoresist waveguide mask is applied to define the first and second active regions separate from one another. Thereafter, a portion of the cladding and at least one quantum well layer are etched away to define the passive region interposed between the first and second active regions.

Alternatively, the unitary two-section semiconductor optical amplifier in accordance with the present invention may be fabricated using selective area growth techniques. Initially, at least one passive waveguide layer is deposited to form a wafer. At least one quantum well layer is then grown on top of the at least one passive waveguide layer to define the first active region, and at least one quantum well layer is grown on top of said at least one passive waveguide layer to define a second active region separate from the first active region. Thereafter, a cladding layer is grown on top of the at least one quantum well layers defining the first and second active regions.

BRIEF DESCRIPTION OF THE DRAWING

The foregoing and other features of the present invention will be more readily apparent from the following detailed description and drawings of illustrative embodiments of the invention wherein like reference numbers refer to similar elements throughout the several views and in which.

DETAILED DESCRIPTION OF THE INVENTION

It has been recognized that the saturation output power of a SOA decreases as the injection current is reduced. This characteristic of SOAs is advantageous when the device is used as an optical power equalizer.

The dynamic interaction between photons and pumped carriers is described by the rate equation of carrier density $$\frac{dN(t)}{dt} = \frac{I(t)}{elA} - \frac{N(t)}{\tau} - \frac{S(N)(N(t) - N_0 \Gamma)}{\hbar wA} P(t),$$

and the saturation output power is $$P_{sat} \frac{\hbar wA}{\tau S(N)\Gamma}$$

where, e is the electron charge;

A is the cross section of the active layers;

l is the length of the active section;

π is the spontaneous carrier life time;

ℏ is Plank's constant;

w is the angular frequency of the propagating radiation;

Γ is the confinement coefficient;

$S(N)(N-N_0)$ is the power gain, wherein $N_0$ is the carrier density at transparency;

N(t) is the average carrier density;
I(t) is the injection current; and
P(t) is the optical power.

Figure 1:
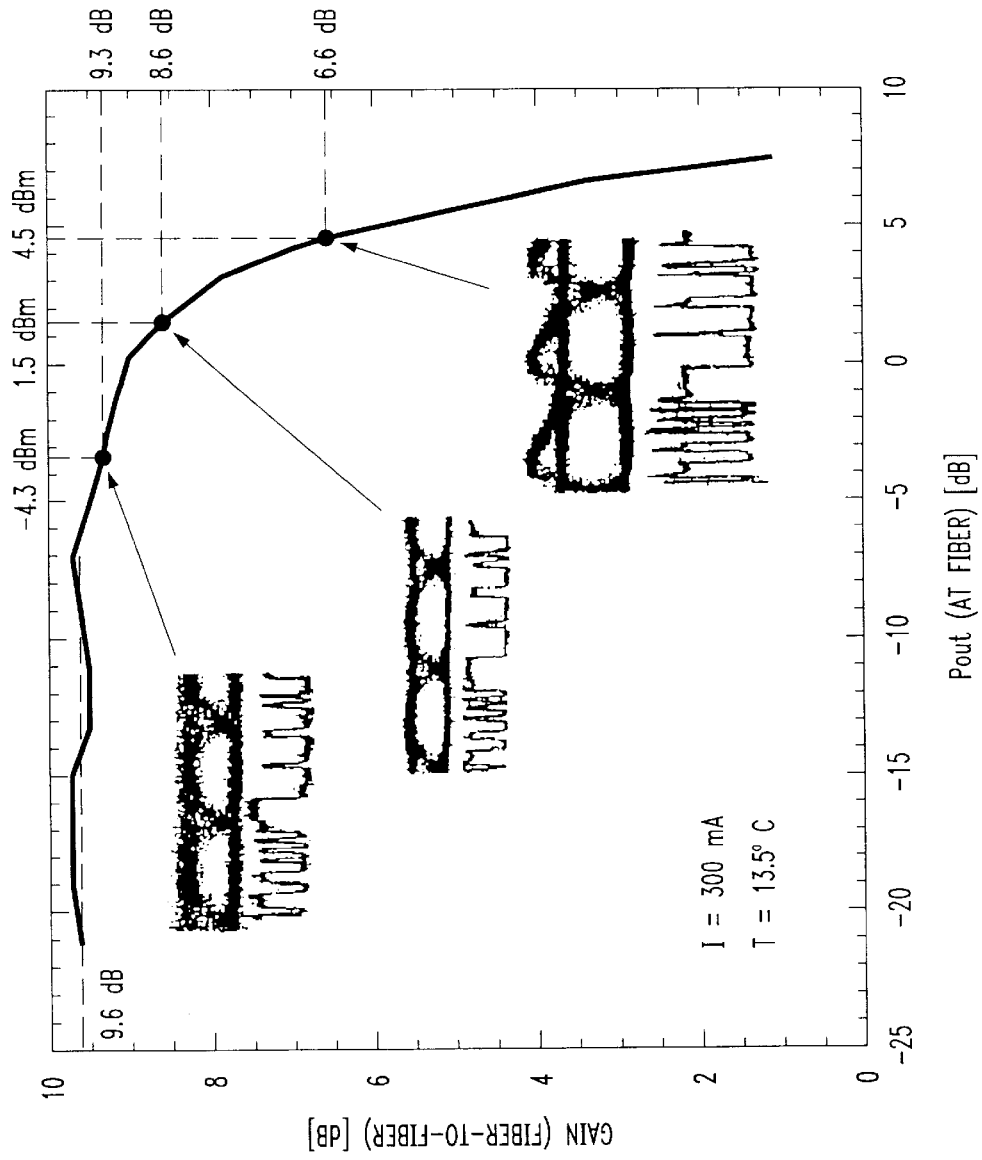
FIG. 1 is a waveform of a conventional single section semiconductor optical amplifier.
Figure 2:
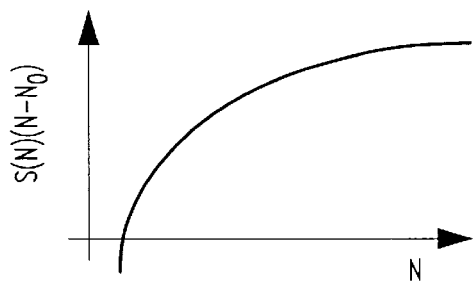
FIG. 2 is a graphical representation of characteristic gain versus carrier density of a conventional single section semiconductor optical amplifier.

FIG. 2 is a graphical representation of the characteristic gain versus carrier density of a conventional single section SOA. This gain characteristic has been used to improve the dynamic performance of multisection semiconductor lasers, as described in the publication by J. C. S. Castro et al., "Improved Signal to Noise Ratio in Gain-Levered Laser", *Electronics Letters*, vol. 31, pp. 1156–1157 (July 1995). The higher the carrier density, the smaller the gain parameter S(N) and thus, the larger the saturation output power.

In order to increase the output power and ensure an open eye pattern, a relatively high current must be injected at the output end of the SOA. The injection of a relatively high current, however, may disadvantageously over amplify the optical signal at the front end and saturate the signal at the output end. In order to overcome this problem, the SOA may be designed to have a sufficient length in order to supply the required output power, yet prevent gain saturation. Such a construction, however, is not suitable for relatively wide-range input power levels.

Figure 3:
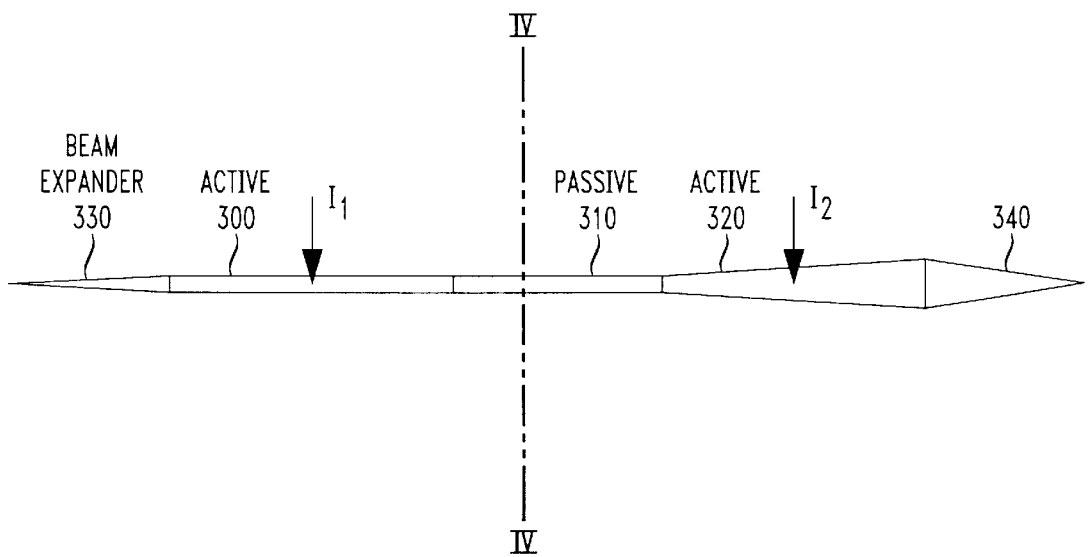
FIG. 3 is a top view of a preferred embodiment of the two-section semiconductor optical amplifier in accordance with the present invention.

According to the present invention, the gain/carrier density relationship is exploited to obtain increased output power by using an integrated two-section (two electrode) SOA, as shown in FIG. 3. By using the two-section SOA relatively high output power levels for a relatively wide-range of input power levels may be realized.

The two-section SOA in accordance with the present invention includes a passive region 310 (an electrical isolator) interposed between a first active region 300 (first electrode or amplifier) and a second active region 320 (second electrode or amplifier) to form an integrated device. In a preferred embodiment, in order to improve the performance of the device the length of the passive region 310 is larger than the thickness of the device, thereby providing thermal isolation and improving heat dissipation. Because of the improved heat dissipation and the longer overall active region, the two-section SOA has a larger small signal fiber-to-fiber gain. As an optical power equalizer, the second electrode 320 is injected with a relatively high current $I_2$ to obtain relatively high saturation output power and gain, while substantially reducing or preventing overshoot. The current $I_1$ to the first electrode 300 is adjusted for various input powers to maintain a substantially constant input power supply to the second electrode 320.

To increase the saturation output power, the width of the second amplifier may be exponentially increased toward its output end, as shown in FIG. 3. Beam expanders 330, 340 are preferably integrated at the input and output ends of the two-section SOA device in order to improve single mode fiber coupling. The widths of the beam expanders are preferably adiabatically reduced. When using beam expanders, the input and output facets of the two-section SOA device are preferably coated with an anti-reflective coating, such as $TiO_2$, so that substantially flat end single mode fibers may be used for optical coupling. In an alternative embodiment, known complex optics may be used at the respective ends of the device instead of beam expanders to improve optical coupling.

Figure 4:
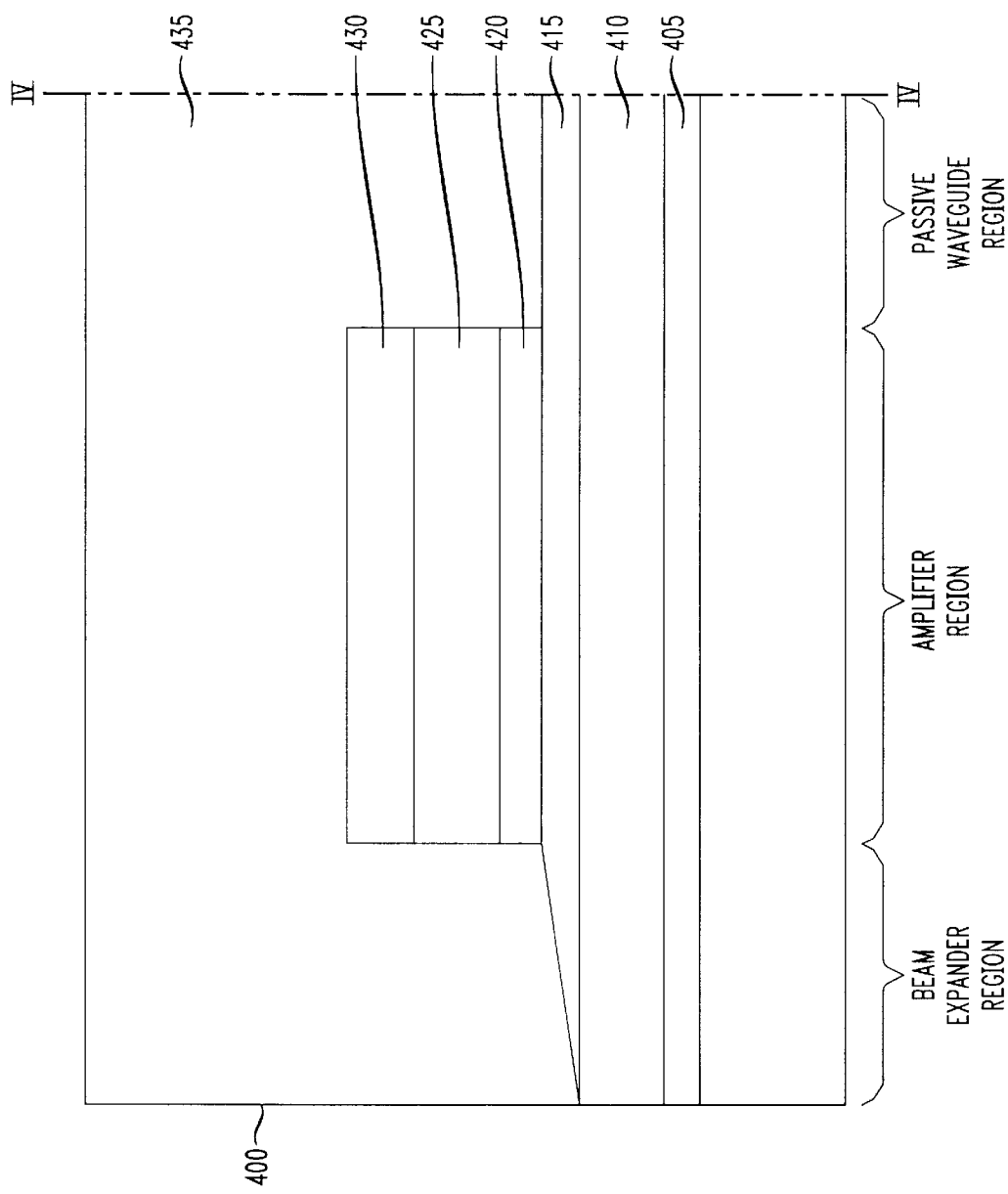
FIG. 4 is a longitudinal cross section of the layers of the left half of the two-section semiconductor optical amplifier in FIG. 3 up to line IV—IV.
Figure 5:
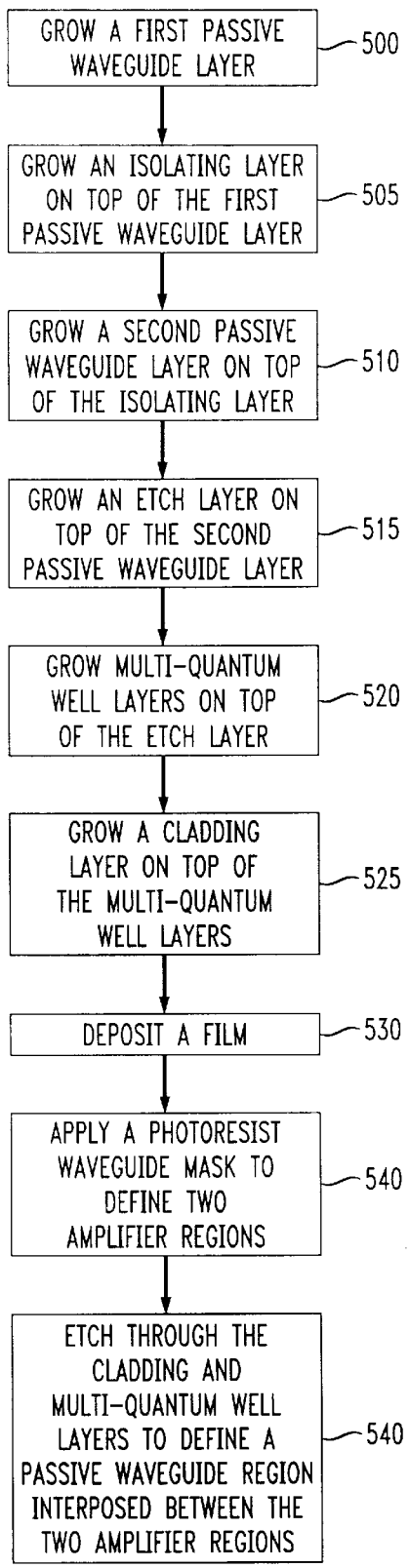
FIG. 5 is a flow chart of an exemplary method for fabricating the two-section semiconductor optical amplifier in accordance with the present invention.

FIG. 4 is a cross-sectional view along the axis of propagation of the left hand side of the SOA shown in FIG. 3 up to line IV—IV. It should be noted that the different layers comprising the left and right hand sides of the SOA are the same, but the respective lengths and widths of each layer may differ. FIG. 5 is a flow chart of the preferred process for manufacture of the two-section SOA of FIG. 3. In a preferred embodiment, the device is fabricated using four metal-organic chemical vapor deposition (MOCVD) epitaxial growth steps, which are then etched to remove the semiconductor from the passive region. By way of example, an InP semiconductor is used, however, other types of semiconductors are contemplated and are within the intended scope of the invention.

Initially, in steps 500–510 a first passive waveguide layer 405 and a second passive waveguide layer 415 are grown on top of one another separated by an n-InP layer 410. Two waveguide layers are only necessary when the two-section SOA device is used as a beam expander; otherwise, the first waveguide layer 405 may be eliminated. Thereafter, in steps 515–525, on top of the second waveguide layer 415 there is grown an etch stop layer 420 followed by multi-quantum well (MQW) layers 425 and an InP cladding layer 430. Any number of quantum wells may be used depending on the desired application of the device. Then in step 530 a film (not shown), such as $SiO_2$, is deposited on the wafer, followed in step 535 by application of a photoresist waveguide mask to the two amplifier regions. Next, in step 540 the film is etched using an etchant to remove the cladding and MQW layers, 430, 425, respectively, from the passive waveguide region interposed between the two active regions. As the layers are etched adiabatically in the longitudinal direction, the optical beam is gradually guided by the underlying thin waveguide layer. Consequently, the beam is expanded both horizontally and vertically.

The remaining portion 435, of the wafer that is electrically isolated and connected to the electrical layers, is then regrown. Specifically, first the nip blocking layers are grown everywhere, except for the waveguide area, which is covered by the $SiO_2$ film. Following the removal of the $SiO_2$ film, the wafer is non-selectively regrown with another blocking layer. A relatively wide slot is then created using selective etchant to remove the regrown blocking layers above the active waveguide. Next, top and contact layers are grown non-selectively. This process of manufacture results in substantially planarized devices with relatively low active/passive transition loss.

Alternative methods and techniques for fabricating the two-section SOA device in accordance with the present invention are within the intended scope of the invention. For example, the two-section SOA device may be fabricated using selective area growth techniques, thereby eliminating the need to etch. This alternative method is advantageous in that the sections of the SOA may be grown independently and thus, the semiconductor used for the first and second amplifiers need not be the same.

Accordingly, the two-section SOA in accordance with the present invention advantageously distributes the injection current properly to the active sections, thereby obtaining increased output power, substantially undistorted open eye patterns, and a wider input dynamic range compared to conventional single section SOAs. The two-section SOA in accordance with the present invention provides with substantially no eye pattern distortion significantly higher substantially constant output power, such as at 5 dBm, than for single-section SOAs. By way of example, in the dynamic range of approximately −11 dBm to approximately 6.5 dBm, the two-section SOA demonstrates open eye patterns with degradation less than approximately 47%.

Thus, while there have been shown, described and pointed out fundamental novel features of the invention as applied to a preferred embodiment thereof, it will be understood that various omissions, substitutions and changes in the form and details of the devices illustrated, and in their operation, may be made by those skilled in the art without departing from the spirit and scope of the invention. For example, it is expressly intended that all combinations of those elements and/or method steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

What is claimed is:

1. A unitary two-section semiconductor optical amplifier comprising:
   a first active region;
   a second active region; and
   a passive region integrally connected between said first and second active regions so as to minimize optical loss therebetween.

2. An optical amplifier in accordance with claim 1, wherein said first active region is a first electrode.

3. An optical amplifier in accordance with claim 1, wherein said first active region is a first optical amplifier.

4. An optical amplifier in accordance with claim 1, wherein said second active region is a second electrode.

5. An optical amplifier in accordance with claim 1, wherein said second active region is a second optical amplifier.

6. An optical amplifier in accordance with claim 1, further comprising fiber coupling means disposed at respective ends of said first and second active regions.

7. An optical amplifier in accordance with claim 6, wherein said fiber coupling means is a beam expander integrally connected to respective ends of said first and second active regions.

8. An optical amplifier in accordance with claim 6, wherein said fiber coupling means are optical elements.

9. An optical amplifier in accordance with claim 1, wherein said first active region produces a first gain and said second active region produces a second gain independent of said first gain.

10. A unitary two-section semiconductor optical amplifier comprising:
    a first active region having a predetermined range of first input power levels and a gain;
    a second active region having a second input power level, said gain in said first active region being increased so that said second input power level remains substantially constant for said predetermined range of first input power levels; and
    a passive region integrally connected between said first and second active regions so as to minimize optical loss therebetween.

11. A unitary two-section semiconductor optical amplifier comprising:
    a first active region having a first current injected at a first current level;
    a second active region having a second current injected at a second current level different from said first current level, said first and second current levels being driven independently of one another; and
    a passive region integrally connected between said first and second active regions so as to minimize optical loss therebetween.

12. A method for fabricating a unitary two-section semiconductor optical amplifier including a first active region, a second active region, and a passive region integrally connected between said first and second active regions so as to minimize optical loss therebetween, comprising the steps of:
    (a) growing at least one passive waveguide layer;
    (b) growing an etch stop layer on top of said at least one passive waveguide layer;
    (c) growing at least one quantum well layer on top of said etch stop layer;
    (d) growing a cladding layer on top of said at least one quantum well layer;
    (e) applying a photoresist waveguide mask to define said active regions separate from one another; and
    (f) etching away a portion of said cladding and at least one quantum well layer to define said passive region interposed between said first and second active regions.

13. A method in accordance with claim 12, wherein said step (a) of growing said at least one passive waveguide layer comprises growing two passive waveguide layers one on top of the other.

14. A method for fabricating a unitary two-section semiconductor optical amplifier including a first active region, a second active region, and a passive region integrally connected between said first and second active regions so as to minimize optical loss therebetween, comprising the steps of:
    (a) growing at least one passive waveguide layer;
    (b) growing at least one quantum well layer on top of said at least one passive waveguide layer to define said first active region;
    (c) growing at least one quantum well layer on top of said at least one passive waveguide layer to define said second active region separate from said first active region; and
    (d) growing a cladding layer on top of said at least one quantum well layers defining said first and second active regions.

15. A method in accordance with claim 14, wherein said at least one quantum well layer defining said first active region is a first semiconductor and said at least one quantum well layer defining said second active region is a second semiconductor.

16. A method in accordance with claim 15, wherein said first and second semiconductors are the same.

17. A method in accordance with claim 15, wherein said first and second semiconductors are different.

18. A method of using a unitary two-section semiconductor optical amplifier including a first active region having a predetermined range of first input power levels and a gain, a second active region having a second input power level, and a passive region integrally connected between said first and second active regions so as to minimize optical loss therebetween, comprising the step of:
    increasing said gain in said first active region so that said second input power level remains substantially constant for said predetermined range of first input power levels.

19. An optical amplifier in accordance with claim 1, wherein said passive region produces substantially zero optical loss.

20. An optical amplifier in accordance with claim 10, wherein said passive region produces substantially zero optical loss.

21. An optical amplifier in accordance with claim 11, wherein said passive region produces substantially zero optical loss.

22. A method in accordance with claim 14, wherein said passive region produces substantially zero optical loss.

23. A method in accordance with claim 18, wherein said passive region produces substantially zero optical loss.

* * * * *

UNITED STATES PATENT AND TRADEMARK OFFICE
CERTIFICATE OF CORRECTION

PATENT NO. : 6,186,631 B1
DATED : February 13, 2001
INVENTOR(S) : Robert E. Behringer It is certified that error appears in the above-identified patent and that said Letters Patent is hereby corrected as shown below:

<u>Title page,</u>
Item [75] Inventor, change "HSIN-CHO" to -- HSIN-CHO CITY, TAIWAN --.

Signed and Sealed this

Thirtieth Day of October, 2001

Attest:

*Nicholas P. Godici*

NICHOLAS P. GODICI
*Attesting Officer*     *Acting Director of the United States Patent and Trademark Office*